United States Patent [19]
Khayrallah et al.

[11] Patent Number: 5,983,385
[45] Date of Patent: Nov. 9, 1999

[54] COMMUNICATIONS SYSTEMS AND METHODS EMPLOYING PARALLEL CODING WITHOUT INTERLEAVING

[75] Inventors: Ali S. Khayrallah, Apex, N.C.; Amer A. Hassan, Kirkland, Wash.

[73] Assignee: Ericsson Inc., Research Triangle Park, N.C.

[21] Appl. No.: 08/911,412

[22] Filed: Aug. 14, 1997

[51] Int. Cl.$^6$ .......................... H03M 13/12; H03M 13/22
[52] U.S. Cl. .......................... 714/755; 714/780; 714/787
[58] Field of Search .................................. 371/37.4, 37.6, 371/38.1, 44; 714/755, 780, 787

[56] References Cited

U.S. PATENT DOCUMENTS

| | | | |
|---|---|---|---|
| 5,107,505 | 4/1992 | Lelandis et al. | 371/37.4 |
| 5,446,747 | 8/1995 | Berrou | 371/45 |
| 5,761,223 | 6/1998 | Ando et al. | 371/41 |
| 5,761,248 | 6/1998 | Hagenauer et al. | 375/340 |
| 5,839,077 | 11/1998 | Kowaguchi | 455/517 |

FOREIGN PATENT DOCUMENTS 0 755 122 A2   7/1996   European Pat. Off. .

OTHER PUBLICATIONS

Robertson et al., "A Novel Bandwidth Efficient Coding Scheme Employing Turbo Codes", Proc. of ICC/SUPERCOMM '96, pp.962–967, Jun. 1996.

Lai et al., *An Efficient Convolutional Coding/Decoding Strategy for Channels with Memory*, IEEE Transactions on Communications, Nov. 1995, No. 11, New York, US, pp. 2678–2686.

International Search Report, PCT/US98/16872, Feb. 8, 1999.

Hassan et al, "*Decoder Utilizing Soft Information Output to Minimize Error Rates*", U.S. Serial No. 08/699,101, filed Aug. 16, 1996.

Bahl et al., "Optimal Decoding of Linear Codes for Minimizing Symbol Error Rate", IEEE Transactions on Information Theory, vol. IT–20, No. 2, Mar. 1974, pp.284–287.

Berrou et al., "Near Shannon Limit Error–Correcting Coding and Decoding: Turbo–Codes (1)", IEEE International Conference on Communications ICC '93, Geneva, Switzerland, May 23–26, 1993, pp. 1064–1070.

Jung et al., "Comprehensive Comparison of Turbo–Code Decoders", IEEE, 1995, pp. 624–628.

Robertson, "Illuminating the Structure of Code and Decoder of Parallel Concatenated Recursive Systematic (Turbo) Codes", IEEE, 1994, pp. 1298–1303.

Proakis, "*Digital Communications, Third Edition*", McGraw–Hill, Inc., 1995, pp. 468–469, 492–500.

*Primary Examiner*—Stephen M. Baker
*Attorney, Agent, or Firm*—Myers Bigel Sibley & Sajovec

[57] ABSTRACT

A source sequence of information symbols is encoded according to each of a plurality of codes to produce a plurality of encoded sequences of symbols, a respective one of the plurality of codes producing a respective one of the plurality of encoded sequences of symbols from the source sequence of information symbols. The plurality of encoded sequences of symbols are combined to produce a sequence of communications symbols. The sequence of communications symbols is processed to produce a communications signal which is then communicated over a communications medium. The communicated communications signal is processed to produce an estimate of the source sequence of information symbols. The source sequence is preferably encoded according to a first error correction code to produce a first encoded sequence of symbols, and encoded according to a second error correction code to produce a second encoded sequence of symbols. The first and second encoded sequences of symbols preferably are multiplexed to produce the sequence of communications symbols. The first error correction code preferably comprises a random error correction code such as a binary convolutional code, while the second error correction code preferably comprises a burst error correction code, for example, a nonbinary convolutional code such as a dual-k convolutional code, thereby providing random and burst error correction capability.

49 Claims, 6 Drawing Sheets

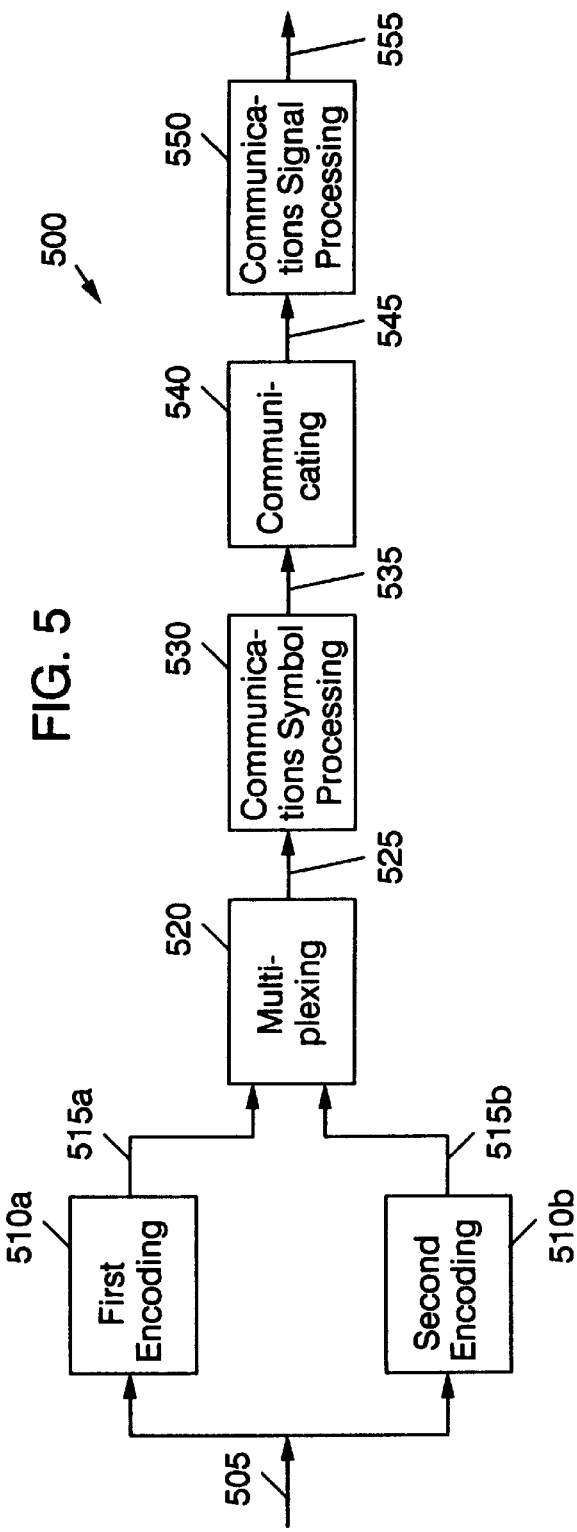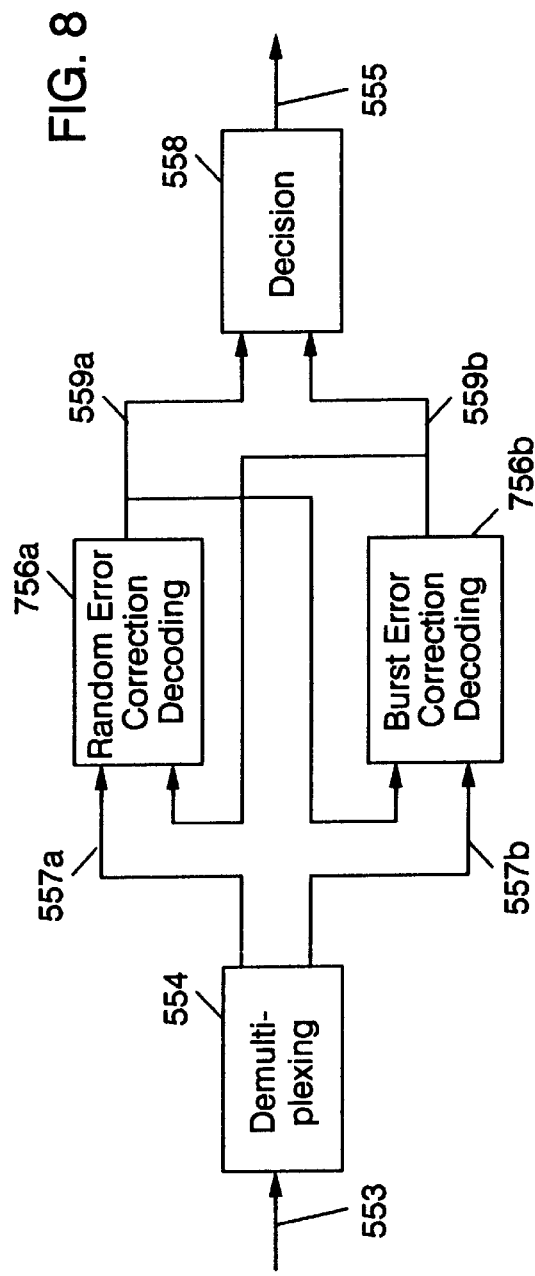

COMMUNICATIONS SYSTEMS AND METHODS EMPLOYING PARALLEL CODING WITHOUT INTERLEAVING

FIELD OF THE INVENTION

The present invention relates to communications systems and methods, in particular, to communications systems and methods employing error correction coding.

BACKGROUND OF THE INVENTION

In a typical communications system, information is transmitted from a sender in the form of a communications signal representing the information. The communications signal typically is communicated to a receiving unit over a communications medium such as a radio, optical fiber, coaxial cable or similar link. Generally, the characteristics of the communications medium introduce disturbances such as noise, delay, and distortion in the communications signal. These disturbance can induce errors when recovering the original information from the communicated communications signal at the receiving unit.

Conventional responses to overcome this problem include increasing transmission power levels and introducing redundancy into the transmitted communications signal in order to increase the probability that the original information may be recovered. However, the ability to increase transmitter power may be limited due to power limitations of transmitter electronics, regulations on peak signal power levels and constraints on the power available for transmitting, for example, power supply limitations in devices such as mobile radiotelephones and satellites.

Redundancy may be introduced into a communications signal by using error control coding techniques. As illustrated in FIG. 1, a typical encoder 110 used in a digital communications system maps a group of k information symbols onto a group of k+n coded symbols, wherein the group of k+n coded symbols represents a "code word" in a set of code words and the additional n symbols in the code word represent redundant symbols. In general, the redundant n symbols can provide an additional "separation" between the words of the set of code words, thus allowing a receiver which receives a group of symbols over a noisy communications channel to more easily discriminate between words of the set of code words, typically by determining which member of the set of code words most closely resembles the received group of symbols.

Many error control codes are effective at correcting random errors, e.g., errors which affect individual symbols in a random distributed fashion, while others are effective at compensating for so-called "burst" errors, e.g., errors which persist over several consecutive symbols. To compensate for burst errors, many systems employ interleaving which reorders symbols in a stream such that burst errors are more randomly distributed, for example, by using a device which stores the symbol stream in rows and then retrieves the stored symbols by columns, such that the sequence retrieved from the device represents a reordering of the original input sequence. To combat random and burst errors, a system such as that illustrated in FIG. 2 may employ a cascade of a random error correction encoder 210 implementing a random error correction code such as a convolutional code, followed by an interleaver 220 which interleaves the symbols produced by the encoder 210 to help combat burst errors.

Another conventional approach uses a combination of random error correcting codes and interleaving to boost the random-error correcting ability in a so-called "turbo coding" scheme, as described in U.S. Pat. No. 5,446,747 to Berrou et al. As illustrated in FIG. 3, a source sequence of information symbols $X_k$ is encoded according to a first systematic code 310, for example, one of a family of recursive systematic codes described in "Near Shannon Limit Error-Correcting Coding and Decoding: Turbo Codes" by Berrou et al., IEEE ICC Conference Record, 1993, pp.1064–1070. The source sequence $X_k$ is also interleaved in a interleaver 320 and then encoded according to a second systematic code 330, thus producing two encoded sequences $Y_{1k}$, $Y_{2k}$ which are multiplexed with the source sequence $X_k$ and transmitted over a communications channel. As illustrated in FIG. 4, the received symbols are passed into a demultiplexer 410 to produce separate symbol sequences $X_k$, $Y_{1k}$, $y_{2k}$. A first sequence $y_{1k}$ is fed into a first decoder 420, producing a log likelihood ratio $LLR_1$ sequence. The log likelihood ratio sequence $LLR_1$ is then interleaved in an interleaver 430 and fed into a cascade of a second decoder 430 and a deinterleaver 460 which produces a second log likelihood ratio sequence $LLR_2$. The second log likelihood ratio sequence $LLR_2$ is used by a decision device 470 to produce an estimated sequence of symbols $d_k$ which represents an estimate of the original sequence $X_k$. The decoding system may also include feedback $w_{2k}$ from the second decoder 440 to the input of the first decoder 420 through a deinterleaver 450.

Although the interleaving systems described above can be effective at reducing burst errors, interleaving can introduce a significant delay into the coding and decoding of the communications signal. This processing delay can be highly undesirable in many applications, for example, by introducing annoying delays in two-way voice communications applications. In addition, interleaving can introduce additional complexity into the decoder design by requiring additional memory. Reducing the depth of the interleaving used can reduce delay, but reducing depth generally reduces the burst-error correcting capability of the coding scheme and may not significantly reduce decoder complexity.

SUMMARY OF THE INVENTION

In light of the foregoing, it is an object of the present invention to provide communications systems and methods which provide enhanced combined random and burst error correcting capabilities.

It is another object of the present invention to provide communications systems and methods which provide enhanced error correcting capabilities with less complex encoder and decoder designs.

These and other objects, features and advantages are provided according to the present invention by communications systems and methods in which a source sequence of information symbols is parallel encoded by first and second codes to produce first and second encoded sequences. Preferably the first and second codes are a random error correction code such as a binary convolutional code, and a burst error correction code such as a nonbinary dual-k convolutional code. The first and second encoded sequences are multiplexed to form a multiplexed sequence of communications symbols which is then communicated over a communications medium in the form of a communications signal produced from the multiplexed sequence of communications symbols. The communications signal, which may be corrupted by noise and distortion, is received and processed to produce a sequence of received communications signals which is then demultiplexed to produce first and second demultiplexed sequences. The first and second sequences preferably are recursively decoded using cross-coupled parallel soft output decoders which employ the random error correction code and the burst error correction code originally used to encode the source sequence, producing an estimated sequence of information symbols which represents an estimate of the source sequence.

The coding schemes of the present invention provide a structure whereby both random and burst errors can be effectively corrected without the complexity and delay often associated with conventional coding schemes. Because the present invention does not require interleaving to combat burst errors, the present invention can avoid the delay associated with interleaving while providing protection against burst errors by utilizing burst error correcting codes. In addition, because interleaving is not required, the present invention can utilize less complex encoder and decoder designs.

In particular, according to the present invention, a communications system for communicating a source sequence of information symbols over a communications medium includes parallel error correction encoding means for encoding the source sequence of information symbols according to a plurality of error correction codes to produce a plurality of encoded sequences of symbols, a respective one of the plurality of error correction codes producing a respective one of the plurality of encoded sequences of symbols from the source sequence of information symbols. Means are provided, responsive to the parallel error correction encoding means, for processing the plurality of encoded sequences of symbols to produce a communications signal. Communications symbol processing means are responsive to the multiplexing means for processing the sequence of communications symbols to produce a communications signal. Communications signal communicating means are responsive to the communications symbol processing means for communicating the communications signal over the communications medium. Communications signal processing means are responsive to the communications signal communicating means to process the communicated communications signal to produce an estimate of the source sequence of information symbols. The first error correction code preferably includes a random error correction code, such as a binary convolutional code, while the second error correction code preferably includes a burst error correction code such as a nonbinary dual-k convolutional code. Random and burst error correcting capability is thereby provided without requiring interleaving.

According to the present invention, the parallel error correction encoding means preferably includes first error correction encoding means for encoding the source sequence of information symbols according to a first error correction code to produce a first encoded sequence of symbols and second error correction encoding means for encoding the source sequence of information symbols according to a second error correction code to produce a second encoded sequence of symbols. The means for processing the plurality of encoded sequences of symbols preferably includes multiplexing means, responsive to the first and second error correction encoding means, for multiplexing the first and second encoded sequences of symbols to produce a sequence of communications symbols. Preferably, the multiplexing means multiplexes the first and second encoded sequences of symbols according to a predetermined multiplexing sequence. The communications signal processing means preferably includes means for processing the communicated communications signal to produce a sequence of received communications symbols, and demultiplexing means for demultiplexing the sequence of received communications symbols according to the predetermined multiplexing sequence to produce a first demultiplexed sequence of communications symbols and a second demultiplexed sequence of communications symbols. Means are provided, responsive to the demultiplexing means, for decoding the first and second demultiplexed sequences according to the first and second error correction codes to produce an estimated sequence of information symbols representing an estimate of the source sequence of information symbols.

The means for decoding the first and second demultiplexed sequences preferably includes first soft output decoding means for decoding the first demultiplexed sequence of communications symbols according to the first error correction code to produce a first sequence of soft information values, second soft output decoding means for decoding the second demultiplexed sequence of communications symbols to produce a second sequence of soft information values, and means for combining the first and second sequences of soft information values to produce an estimated sequence of information symbols representing an estimate of the source sequence of information symbols. Preferably, the first soft output decoding means includes means for decoding the first demultiplexed sequence of communications symbols according to the first error correction code augmented by the second sequence of soft information values. The second soft output decoding means preferably includes means, responsive to the first soft output decoding means, for decoding the second demultiplexed sequence of communications symbols according to the second error correction code augmented by the first sequence of soft information values. Decision means, responsive to the first and second soft output decoding means, preferably determine a value for the one bit of the one estimated information symbol based on the iteratively computed soft information values.

According to method aspects of the present invention, a source sequence of information symbols is encoded according to each of a plurality of codes to produce a plurality of encoded sequences of symbols, a respective one of the plurality of codes producing a respective one of the plurality of encoded sequences of symbols from the source sequence of information symbols. The plurality of encoded sequences of symbols are combined to produce a sequence of communications symbols. The sequence of communications symbols is processed to produce a communications signal, which is then communicated over a communications medium. The communicated communications signal is processed to produce an estimate of the source sequence of information symbols. The source sequence is preferably encoded according to a first error correction code to produce a first encoded sequence of symbols, while the source second is also encoded according to a second error correction code to produce a second encoded sequence of symbols. The first and second encoded sequences of symbols preferably are multiplexed to produce the sequence of communications symbols. The first error correction code preferably includes a random error correction code such as a binary convolutional code, while the second error correction code preferably includes a burst error correction code, for example, a nonbinary convolutional code such as a dual-k convolutional code. Random and burst error correction are thereby provided.

Preferably, the first and second encoded sequences of symbols are multiplexed according to a predetermined multiplexing sequence. The communicated communications signal is processed to produce a sequence of received communications symbols, and the sequence of received communications symbols demultiplexed according to the predetermined multiplexing sequence to produce a first demultiplexed sequence of communications symbols and a second demultiplexed sequence of communications symbols. The first and second demultiplexed sequences are then decoded according to the first and second error correction codes to produce an estimated sequence of information symbols representing an estimate of the source sequence of information symbols.

The first demultiplexed sequence of communications symbols is preferably decoded according to the first error correction code to produce a first sequence of soft information values, while the second demultiplexed sequence of communications symbols according to the second error correction code to produce a second sequence of soft information values. The first and second sequences of soft information values are combined to produce an estimated sequence of information symbols representing an estimate of the source sequence of information symbols. According to a preferred recursive decoding aspect, the first demultiplexed sequence of communications symbols preferably is decoded according to the first error correction code augmented by the second sequence of soft information values. The second demultiplexed sequence of communications symbols is preferably decoded according to the second error correction code augmented by the first sequence of soft information values.

According to another aspect, a respective information symbol of the source sequence of information symbols includes at least one bit, a respective bit having one of a first value and a second value associated therewith. The first and second demultiplexed communications are decoded by computing a first soft information value for one bit of one estimated information symbol from the first demultiplexed sequence of communications symbols according to the first error correction code, the first soft information value representing a relative measure of the likelihood of a corresponding bit in a corresponding symbol of the source sequence of information symbols having the first value or the second value. A second soft information value for the one bit of the one estimated information symbol is then computed from the second demultiplexed sequence according to the second error correction code, the second soft information value representing a relative measure of the likelihood of a corresponding bit in a corresponding symbol of the source sequence of information symbols having the first value or the second value.

Preferably, the first soft information value for the one bit of one estimated information symbol is computed from the first demultiplexed sequence of communications symbols according to the first error correction code augmented by a soft information value for the one bit of the one estimated information symbol previously computed from the second demultiplexed sequence of communications symbols. The second soft information value preferably is computed for the one bit of the one estimated information symbol from the second demultiplexed sequence of communications symbols according to the second error correction code augmented by a soft information value for the one bit of the one estimated information symbol previously computed from the first demultiplexed sequence of communications symbols. Decoding of the first and second demultiplexed sequences preferably includes iterating the computation of soft information values from the first and second demultiplexed sequences until a predetermined iteration criterion is satisfied. After iteratively computing the soft information values, a value for the one bit of the one estimated information symbol is determined based on the iterative computed soft information values computed from the first and second demultiplexed sequences of communications symbols.

BRIEF DESCRIPTION OF THE DRAWINGS

Some of the objects and advantages of the present invention having been stated, others will be more fully understood from the detailed description that follows and by reference to the accompanying drawings in which:

FIG. 5 illustrates a communications system according to the present invention;

FIGS. 7 and 8 illustrate a preferred embodiment of a communications system according to the present invention.

DETAILED DESCRIPTION OF PREFERRED EMBODIMENTS

Figure 1:
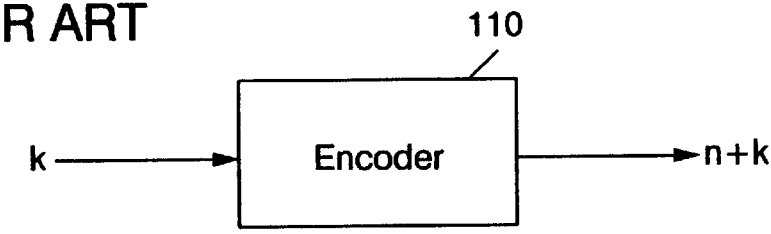
FIG. 1 illustrates an encoder according to the prior art.
Figure 2:
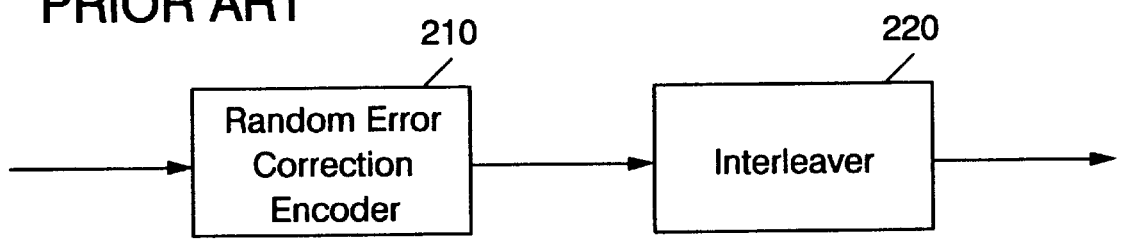
FIGS. 2–4 illustrate interleaving for burst error protection according to the prior art.
Figure 3:
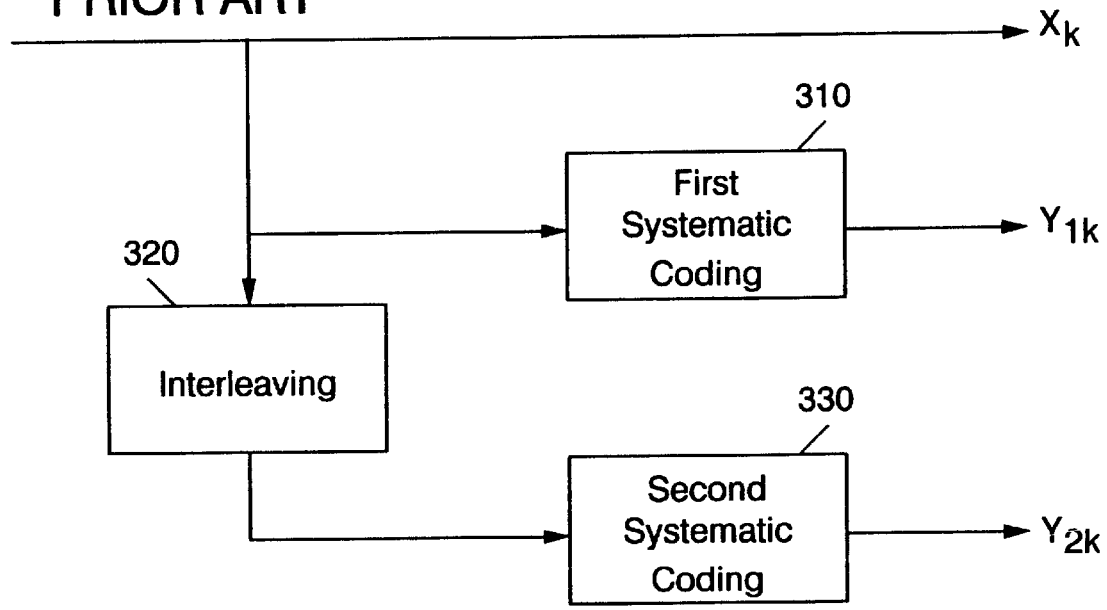
Figure 4:
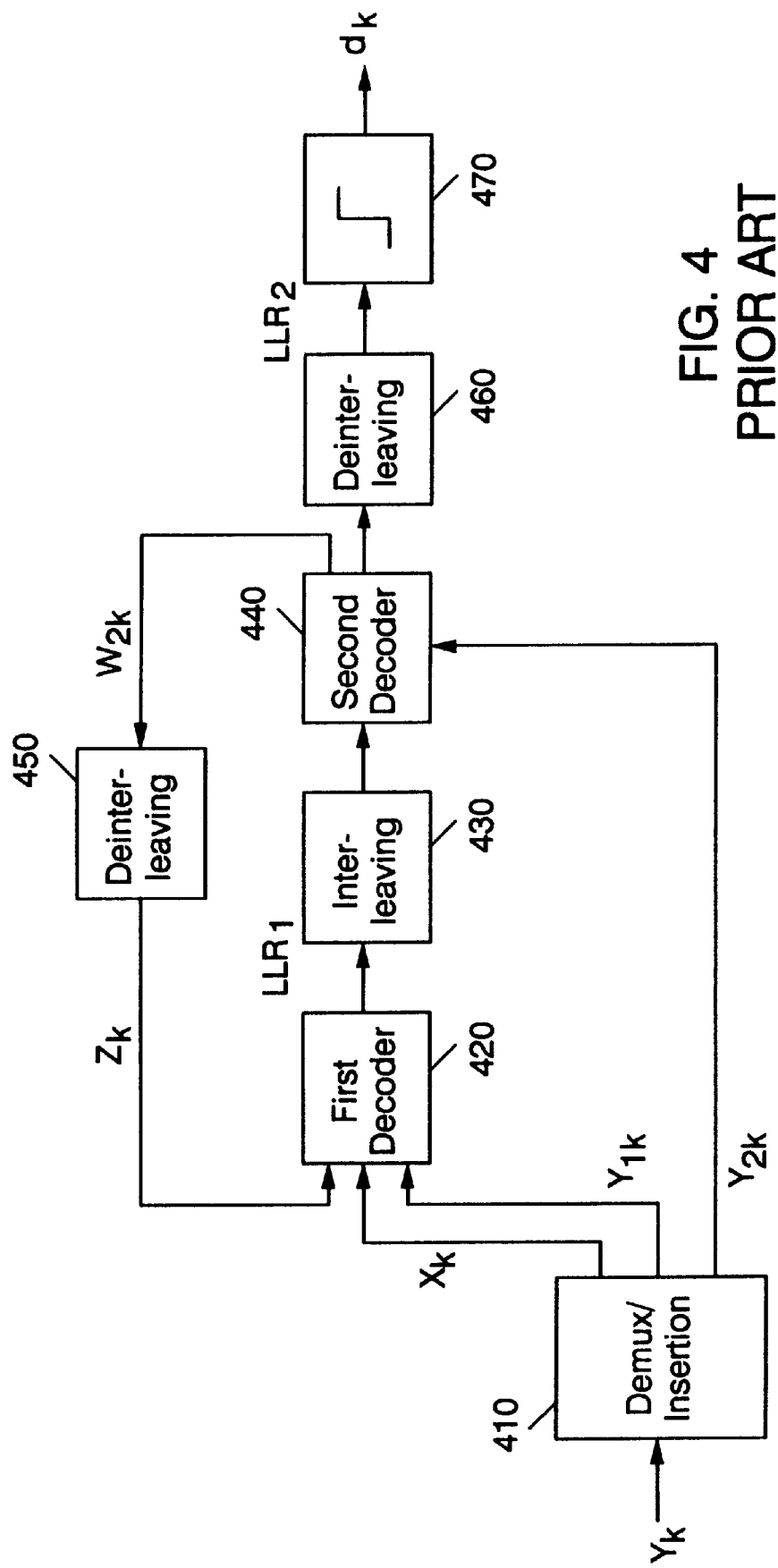

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

FIG. 5 illustrates a communications system 500 according to the present invention, including first and second encoding means 510$a$, 510$b$ which encode a source sequence 505 of information symbols according to first and second codes, respectively, to produce first and second encoded sequences 515$a$, 515$b$ of symbols, respectively. The first and second encoded sequences 515$a$, 515$b$ are input into multiplexing means 520 which produces a multiplexed sequence of communications symbols 525 therefrom. Communications symbol processing means 530 produces a communications signal 535 from the multiplexed sequence 525, which is then communicated over a communications medium, e.g., a radio link, a fiber optic link or the like, by communications signal communicating means 540. The communicated communications signal 545 is then processed by communications signal processing means 550 to produce an estimated sequence of information symbols 555 which represents an estimate of the source sequence of information symbols 505.

Those skilled in the art will appreciate that the first and second encoding means 510$a$, 510$b$, multiplexing means 520, communications symbol processing means may be implemented using a variety of hardware, software or combinations thereof. For example, the first and second encoding means 510$a$, 510$b$ may be implemented using software running on a computer or other data processing apparatus, firmware running on special purpose hardware such as digital signal processing (DSP) chips, or combinations thereof. The communications symbol processing means 530 may include such commonly used communications components as interleavers, digital to analog converters (D/As), modulators, and the like. Functions of the first and second encoding means 510a, 520b, multiplexing means 520, and the communications symbol processing means 530, for example, may also be integrated in special purpose hardware and/or software such as an application specific integrated circuit (ASIC), or may be distributed among different components. Communications signal communicating means 540 may be implemented with commonly used communications components such as amplifiers, antennas, receivers, and the like which are appropriate for the communications medium used, e.g., a radio link, fiber optic link, coaxial cable and the like. The operations of these components are well-known to those skilled in the art and need not be described in greater detail herein.

Figure 6:
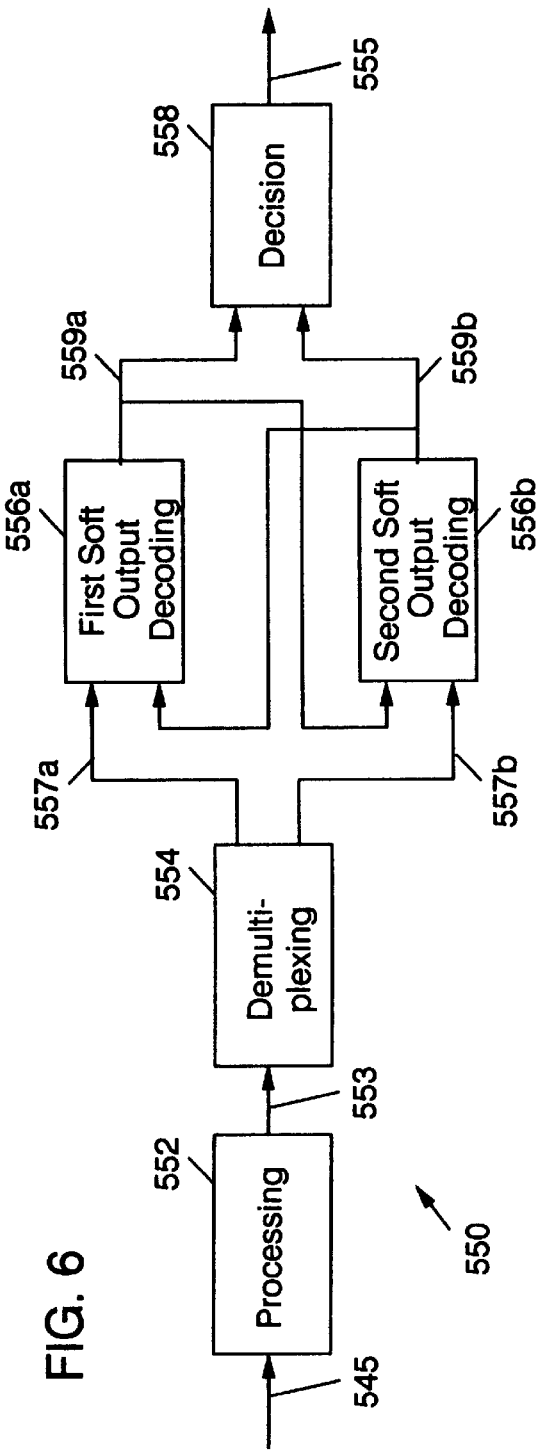
FIG. 6 illustrates a decoder embodiment according to the present invention.

Referring now to FIG. 6, communications signal processing means 550 preferably includes processing means 552 which produces a sequence of received communications symbols 553 from the communicated communications signal 545.

Demultiplexing means 554 demultiplexes the sequence of received communications symbols 553, preferably according to the same sequence used in multiplexing means 520 of FIG. 5, to produce first and second demultiplexed sequences 557a, 557b. First and second soft output decoding means 556a, 556b, decode the first and second demultiplexed sequences 557a, 557b, respectively, to produce first and second soft information sequences 559a, 559b, respectively. The first soft output decoding means 556a decodes the first demultiplexed sequence 557a according to the first code employed in the first decoding means 510a of FIG. 5, preferably augmented by the second soft information sequence 559b which is fed back from the second soft output decoding means 556b. Similarly, the second soft output decoding means 556b decodes the second demultiplexed sequence 557b according to the second code employed in the second encoding means 510b of FIG. 5, preferably augmented by the first soft information sequence 559a which is fed back to the first soft output decoding means 556a. Decision means 558 determines an estimated sequence 555 of information symbols representing an estimate of the source sequence 505, from the first and second soft information sequences 559a, 559b.

Those skilled in the art will appreciate that processing means 552, demultiplexing means 554, first and second soft output decoding means 556a, 556b, and decision means 558 may include such commonly used communications components as matched filters, demodulators, analog to digital converters (A/Ds), signal processors and the like. The operations of these components are well-known to those skilled in the art and need not be discussed in greater detail herein. It will be understood that processing means 552, demultiplexing means 554, first and second soft output decoding means 556a, 556b, and decision means 558 generally may implemented using special purpose hardware, software running on computers or other data processing apparatus, or combinations thereof.

Those skilled in the art will appreciate that the first and second soft output decoding means 556a, 556b may utilize a number of different decoding techniques or algorithms. For example, the first and second soft output decoding means 556a, 556b may employ a soft output decoder of the type described in U.S. patent application Ser. No. 08/699,101 to Hassan et al., commonly assigned to the assignee of the present invention. According to the decoder disclosed therein, a maximum a posteriori (MAP) estimate is generated for a symbol which is to be decoded, and then a soft information value is produced for each bit position in the symbol, the soft information output providing an indication of the relative probabilities of a particular bit having a particular binary value. Those skilled in the art will appreciate that other types of decoders which produce a soft information output may also be used according to the present invention, for example, a MAP symbol estimator as described in "Optimal decoding of linear codes for minimizing symbol error rate," by Bahl et al, or a sequence estimator utilizing a soft output Viterbi algorithm (SOVA). Those skilled in the art will also appreciate that decoding by the first and second soft output decoding means 556a, 556b and decision means 558 may occur in an iterative fashion, which may involve, for example, a fixed number of iterative computations of estimates for a symbol in the first and second decoding means 556a, 556b, or a selective recursive decoding process based on reliability metrics produced by the decoding means 556a, 556b as described in the patent application entitled "Communications Systems and Methods Employing Selective Recursive Decoding", by Hassan et al., assigned to the assignee of the present application and filed concurrently herewith.

Figure 7:
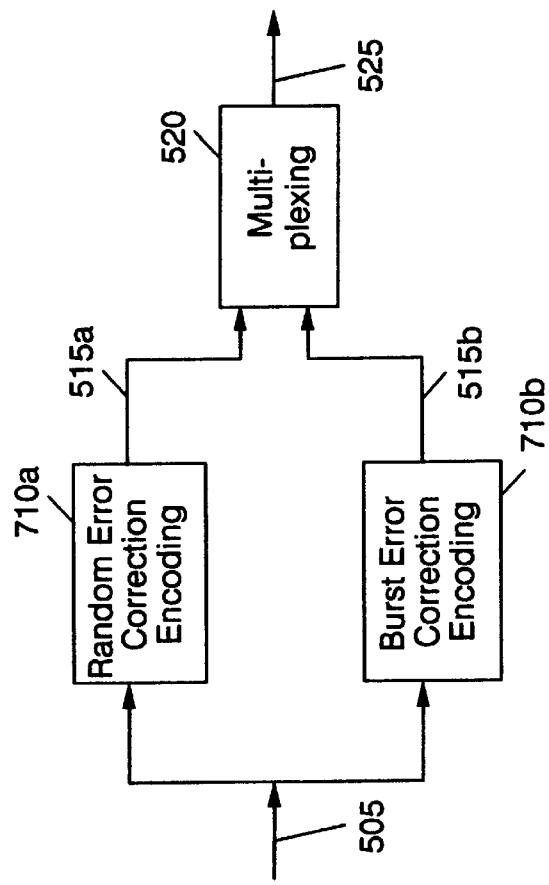

FIGS. 7 and 8 illustrate preferred embodiments according to the present invention which provide improved random and burst error correcting capability. A source sequence 505 of information symbols is encoded according to a random error correction code, e.g., a binary convolutional code or a block code, in random error correction encoding means 710a, producing a first encoded sequence 515a. The source sequence 505 is also encoded according to a burst error correction code, e.g., a nonbinary convolutional code such as a dual-k convolutional code, in burst error correction encoding means 710b, producing a second encoded sequence 515b. The first and second encoded sequences 515a, 515b are multiplexed by multiplexing means 520 to produce a multiplexed sequence 525 which is encoded to protect against random and burst errors. As those skilled in the art will appreciate, prior to multiplexing, the first and second encoded sequences 525a, 525b may be suitably punctured to produce a desired coding rate for the multiplexed sequence 525. The multiplexed sequence 525 may then be communicated over a communications medium, as described with reference to FIGS. 5 and 6, above.

Referring now to FIG. 8, a sequence 553 of received communications symbols is demultiplexed in demultiplexing means 554 to produce first and second demultiplexed sequences 557a, 557b, as described in reference to FIG. 6. The first and second demultiplexed sequences 557a, 557b are decoded by random error correction decoding means 756a and burst error decoding means 756b to produce first and second soft information sequences 559a, 559b. The random error correction decoding means 756a preferably decodes the first demultiplexed sequence 557a according to the random error correction code of the random error correction encoding means 710a of FIG. 7, preferably augmented by the second soft information sequence 559b. Similarly, the burst error correction decoding means 756b decodes the second demultiplexed sequence 557b according to the burst error correction code of the burst error correction encoding means 710b of FIG. 7, preferably augmented by the first soft information sequence 759a. Decision means 558 determines an estimated sequence of information symbols 555 from the first and second soft information sequences 559a, 559b.

Those skilled in the art will appreciate that because the random error correction decoding means 756a is good at correcting random errors and the burst error correction decoding means 756b is good at correcting burst errors, at least one of the random error correction decoding means 756a and the burst error correction decoding means 756b will usually be confident of its estimate of the source sequence. Because of this, the information from the decoder with a higher confidence level can be used to bias the output of the decoder with a lesser confidence level to enable the latter to bias its estimate in favor of the former. In cases where the soft outputs from the two decoders have similar confidence in opposite estimates, the decision means 558 can arbitrate between the estimates based on a predetermined selection criterion. For example, the decision means may include a random number generator which may be used to randomly select between the two differing estimates, or a threshold detector which rejects both estimates if neither exhibits a sufficiently high confidence level.

Those skilled in the art will appreciate that the random error correction and burst error correction encoding means 710a, 710b, as well as the random error correction and burst error correction decoding means 756a, 756b may be implemented using, for example, specialized hardware such as an application specific integrated circuit (ASIC) or firmware running on special purpose computing hardware such as a digital signal processing (DSP) chip. It will also be understood that the random error correction encoding means 710a, the burst error correction encoding means 710b, the random error correction decoding means 756a, and the burst error correction decoding means 756b generally may implemented using special purpose hardware, software running on computers or other data processing apparatus, or combinations thereof.

Those skilled in the art will appreciate that the random error correction code utilized in the random error correction encoding means 710a and the random error correction decoding means 756a may be one of a number of commonly used codes which are suitable for correcting random errors in a communicated sequence of symbols, for example, a binary convolutional code or a block code suited for random error correction. The burst error correction code utilized in the burst error correction encoding means 710b and the burst error correction decoding means 756b may include a number of different codes designed for burst error correction without interleaving, such as the class of nonbinary convolutional codes known as dual-k convolutional codes described in *Digital Communications,* by Proakis, 3d edition published by McGraw-Hill, pp. 492–500.

Figure 9:
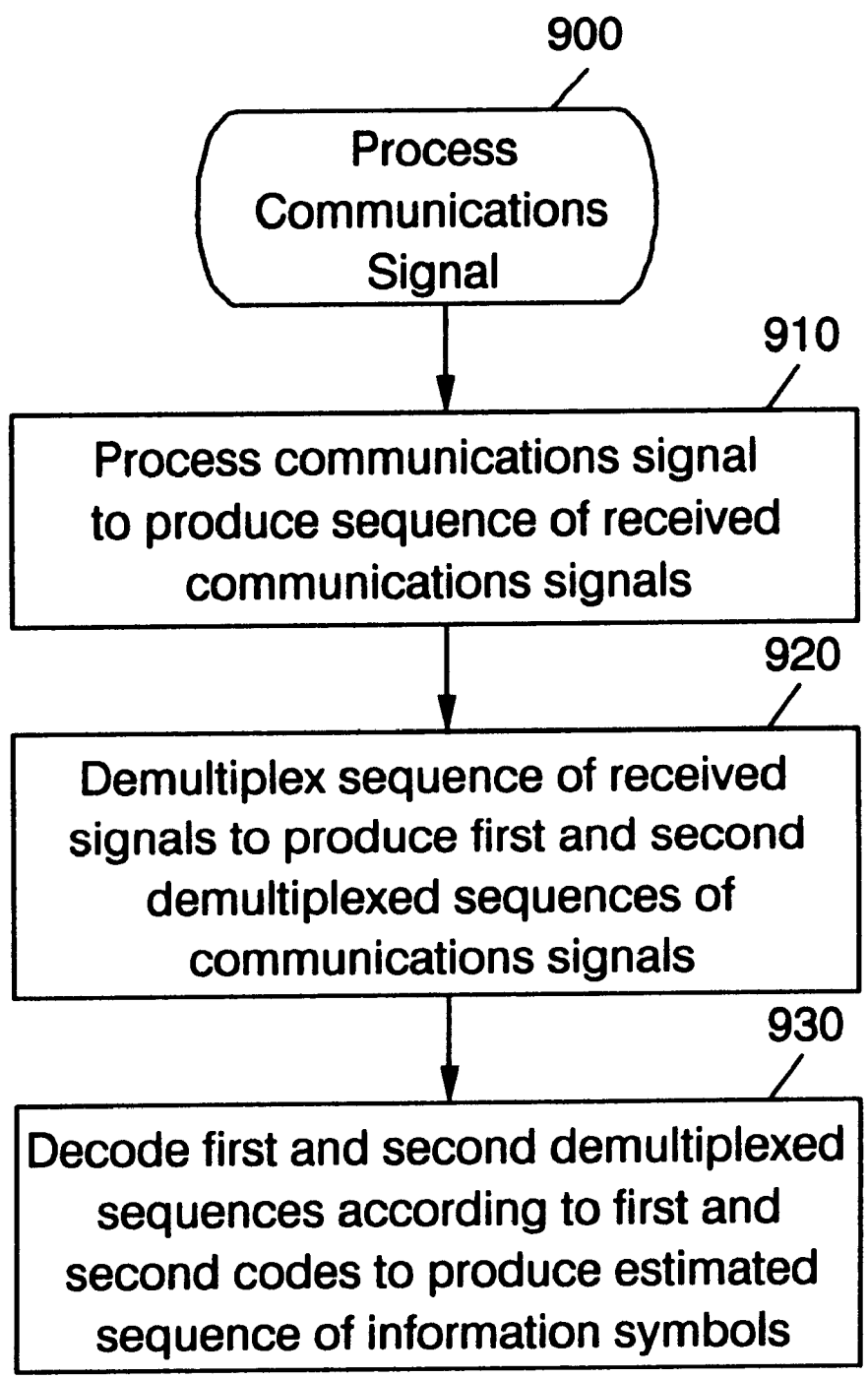
FIGS. 9 and 10 illustrate operations for processing a communications signal according to the present invention.
Figure 10:
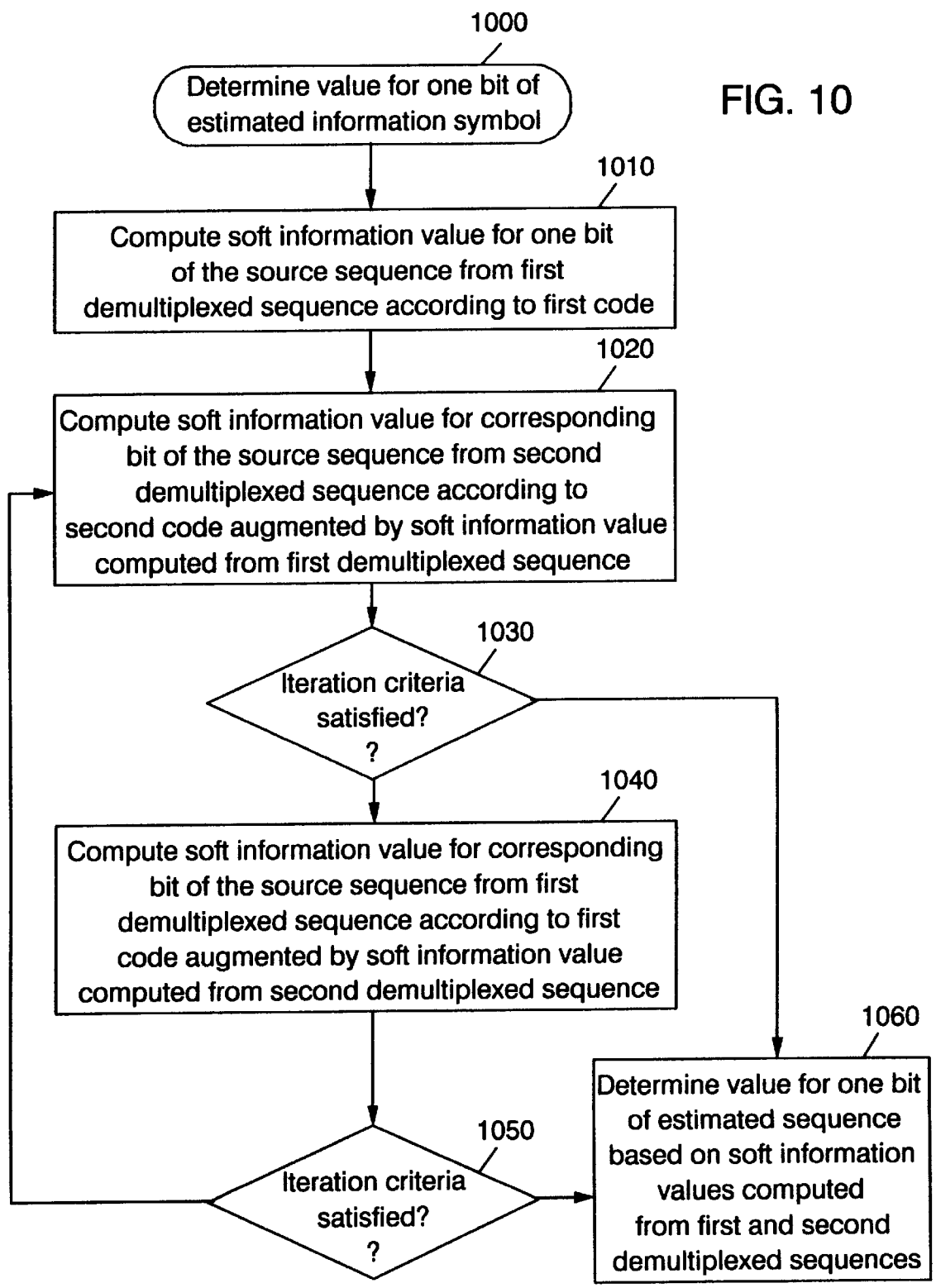

FIGS. 9–10 are flowchart illustrations of methods and apparatus for processing a communications signal to produce an estimated sequence of information symbols which represents an estimate of the source sequence of information symbols communicated by the communications signal. Those skilled in the art will understand that each block of the flowchart illustrations, and combinations of blocks in the flowchart illustrations, may be implemented with various commonly used communications system components. It will also be understood that portions of the operations described in the flowchart illustrations may be executed as computer program instructions loaded in a computer or other data processing apparatus, thus producing a machine which provides means for implementing the functions specified in the flowchart blocks and combinations thereof. The computer program may cause operational steps to be performed on the computer or data processing apparatus to produce a computer-implemented process such that the instructions which execute on the computer or data processing apparatus provide steps for implementing the functions of the flowchart blocks or combinations thereof. Accordingly, blocks of the flowchart illustrations support combinations of means for performing the specified functions and combinations of steps for performing the specified functions.

FIG. 9 illustrates operations (Block 900) for processing a communications signal which represents a source information sequence encoded according to parallel first and second codes as described above. The communications signal is processed to produce a sequence of received communications symbols (Block 910). The sequence of received communications symbols are demultiplexed to produce first and second demultiplexed sequences of symbols (Block 920). The first and second demultiplexed sequences are then decoded according to the first and second codes to produce an estimated sequence of information symbols representing an estimate of the source sequence of information symbols from which the communications signal was produced (Block 930).

FIG. 10 illustrates detailed operations (Block 1000) for determining a value of a bit of a symbol of the estimated sequence according to a preferred iterative decoding aspect. A soft information value is computed for one bit of the source sequence from the first demultiplexed sequence using the first code (Block 1010). A soft information value is then computed for the one bit from the second demultiplexed sequence according to the second code and the soft information value computed from the first demultiplexed sequence (Block 1020). If an iteration criterion is satisfied, a value for the one bit is determined based on the soft information values computed from the first and second demultiplexed sequences (Block 1060). If the iteration criterion is not satisfied, a new soft information value is computed for the one bit from the first demultiplexed sequence according to the first code augmented by the soft information value computed from the second demultiplexed sequence (Block 1040). If an iteration criterion is satisfied (Block 1050), the value of the one bit is determined from the soft information values computed from the first and second demultiplexed sequences (Block 1060). If not, a new soft information value is computed from the second demultiplexed sequence, augmented by the soft information value previously computed from the first demultiplexed sequence (Block 1020). The iterations (Blocks 1020–1050) are preferably repeated until the iteration criterion is satisfied.

An example of how an output of one soft decoder can be used to augment a second soft output decoder will now be explained with reference to FIGS. 5 and 6. Assuming systematic encoding, let x denote information bits of a source sequence 505, y denote parity bits produced by the first encoding means 510a and z denote parity bits produced by the second encoding means 510b. At the communications signal processing means 550, a demodulator may produce sequences $\hat{x}$, $\hat{y}$, and $\hat{z}$, corresponding to x, y, and z. The first soft output decoding means 556a processes $\hat{x}$ and $\hat{y}$, augmented by information from the second soft output decoding means 556b, and the second soft output decoding means 556b processes $\hat{x}$ and $\hat{z}$, augmented by information from the first soft output decoding means 556a.

In particular, the first soft output decoding means 556a accepts sequences $\hat{x}$ and $\hat{y}$, in addition to bias information $L_j^{(2)}$ from the second soft output decoding means 556b. The first time the first soft output decoding means 556a operates, $L_j^{(2)}$ may not be available, and thus may be replaced by 1 for all j. From $L_j^{(2)}$ the first soft output decoding means 556a first computes:

$$q_j^{(2)}(0) = \frac{L_j^{(2)}}{\left(1 + L_j^{(2)}\right)}$$

and $$q_j^{(2)}(1) = 1 - q_j^{(2)}.$$

The first soft output decoding means 556a next computes a likelihood ratio $l_i^{(l)}$ for bit $x_i$:

$$l_i^{(1)} = \frac{\sum_{x:x_i=0} \prod_j p(\hat{x}_j | x_j) \prod_k p(\hat{y}_k | y_k) \prod_l q_l^{(2)}(x_l)}{\sum_{x:x_i=1} \prod_j p(\hat{x}_j | x_j) \prod_k p(\hat{y}_k | y_k) \prod_l q_1^{(2)}(x_l)},$$

where $p(\hat{x}_j|xj)$ and $p(\hat{y}_k|y_k)$ depend on a channel model. From the viewpoint of the first soft output decoding means 556a, a value $l_i^{(1)}>1$ indicates that $x_i=0$ and a value $l_i^{(1)} \leq 1$ indicates that $x_i=1$,. The first soft output decoding means 556a also computes "intrinsic" information $$M_i^{(1)} = \frac{p(\hat{x}_i | x_i = 0)}{p(\hat{x}_i | x_i = 1)},$$

and "extrinsic" information $$L_i^{(1)} = \frac{l_i^{(1)}}{M_i^{(1)}}.$$

The second soft output decoding means 556b may operate similarly, accepting sequences $\hat{x}$ and $\hat{z}$, as well as bias information $L_j^{(1)}$ from the first soft output decoding means 556a. The second soft output decoding means 556b may compute $l_i^{(2)}$ and $L_i^{(2)}$ in the same manner that the first soft output decoding means 556a computes $l_i^{(1)}$ and $L_i^{(l)}$. Again, a value $l_i^{(2)}>0$ indicates that $x_i=0$, and a value $l_i^{(2)} \leq 0$ indicates that $x_i=1$, from the viewpoint of the second soft output decoding means 556b. The second soft output decoding means 556b also sends extrinsic information $L_i^{(2)}$ as bias information to the first soft output decoding means 556a.

Those skilled in the art will appreciate that the operations described above may be varied according to the present invention to include additional operations, rearrangement of the illustrated operations, or combinations thereof. For example, the soft information values used to augment the computation of additional soft information values may be assigned various weighting factors, which in turn may be adaptively adjusted, for example, depending on estimated channel characteristics. In another variation, multiple previously computed soft information values might be utilized to augment computation of a new soft information value.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A communications system for communicating a source sequence of information symbols over a communications medium, the system comprising:

parallel error correction encoding means including:

first error correction encoding means for encoding the source sequence of information symbols according to a first error correction code to produce a first encoded sequence of symbols;

second error correction encoding means for encoding the source sequence of information symbols according to a second error correction code to produce a second encoded sequence of symbols;

multiplexing means, responsive to said first and second error correction encoding means, for multiplexing the first and second encoded sequences of symbols to produce a sequence of communications symbols;

communications symbol processing means, responsive to said multiplexing means, for processing the sequence of communications symbols to produce a communications signal;

communications signal communicating means, responsive to said communications symbol processing means, for communicating the communications signal over the communications medium;

means for processing the communicated communications signal to produce a sequence of received communications symbols;

demultiplexing means, responsive to said means for processing the communicated communications signal to produce a sequence of received communications symbols, for demultiplexing the sequence of received communications symbols according to the predetermined multiplexing sequence to produce a first demultiplexed sequence of communications symbols and a second demultiplexed sequence of communications symbols; and means, responsive to said demultiplexing means, for decoding the first and second demultiplexed sequences according to the first and second error correction codes to produce an estimated sequence of information symbols representing an estimate of the source sequence of information symbols, said means for decoding to the first and second demultiplexed sequences including:

first soft output decoding means for decoding the first demultiplexed sequence of communications symbols according to the first error correction code to produce a first sequence of soft information values;

second soft output decoding means for decoding the second demultiplexed sequence of communications symbols to produce a second sequence of soft information values; and means, responsive to said first and second soft output decoding means, for combining the first and second sequences of soft information values to produce an estimated sequence of information symbols representing an estimate of the source sequence of information symbols.

2. A system according to claim 1:

wherein said first soft output decoding means comprises means, responsive to said second soft output decoding means, for decoding the first demultiplexed sequence of communications symbols according to the first error correction code augmented by a second sequence of soft information values to provide a first sequence of soft information values; and wherein said second soft output decoding means comprises means, responsive to said first soft output decoding means, for decoding the second demultiplexed sequence of communications symbols according to the second error correction code augmented by the first sequence of soft information values to provide the second sequence of soft information values.

3. A system according to claim 1, wherein a respective information symbol of the source sequence of information symbols includes at least one bit, a respective bit having one of a first value and a second value associated therewith, and:

wherein said first soft output decoding means comprises means for computing a first soft information value for one bit of one estimated information symbol from the first demultiplexed sequence of communications symbols according to the first error correction code, the first soft information value representing a relative measure of the likelihood of a corresponding bit in a corresponding symbol of the source sequence of information symbols having the first value or the second value;

wherein said second soft output decoding means comprises means for computing a second soft information value for the one bit of the one estimated information symbol from the second demultiplexed sequence according to the second error correction code, the second soft information value representing a relative measure of the likelihood of a corresponding bit in a corresponding symbol of the source sequence of information symbols having the first value or the second value.

4. A system according to claim 3:

wherein said first soft output decoding means comprises means for iteratively computing a soft information value for one bit of one estimated information symbol from the first demultiplexed sequence of communications symbols according to the first error correction code augmented by a soft information value for the one bit of the one estimated information symbol previously computed from the second demultiplexed sequence of communications symbols, until a predetermined iteration criterion is satisfied;

wherein said second soft output decoding means comprises means for iteratively computing a soft information value for the one bit of the one estimated information symbol from the second demultiplexed sequence of communications symbols according to the second error correction code augmented by a soft information value for the one bit of the one estimated information symbol previously computed from the first demultiplexed sequence of communications symbols, until a predetermined iteration criterion is satisfied.

5. A system according to claim 4, further comprising decision means, responsive to said first and said second soft output decoding means, for determining a value for the one bit of the one estimated information symbol based on the iteratively computed soft information values.

6. A communications system for communicating a source sequence of information symbols over a communications medium, the system comprising:

parallel error correction encoding means including:
first error correction encoding means for encoding the source sequence of information symbols according to a first error correction code to produce a first encoded sequence of symbols, wherein the first error correction code comprises a random error correction code;
second error correction encoding means for encoding the source sequence of information symbols according to a second error correction code to produce a second encoded sequence of symbols, wherein the second error correction code comprises a burst error correction code;

multiplexing means, responsive to said first and second error correction encoding means, for multiplexing the first and second encoded sequences of symbols to produce a sequence of communications symbols;

communications symbol processing means, responsive to said multiplexing means, for processing the sequence of communications symbols to produce a communications signal;

communications signal communicating means, responsive to said communications symbol processing means, for communicating the communications signal over the communications medium;

means for processing the communicated communications signal to produce a sequence of received communications symbols;

demultiplexing means, responsive to said means for processing the communicated communications signal to produce a sequence of received communications symbols, for demultiplexing the sequence of received communications symbols according to the predetermined multiplexing sequence to produce a first demultiplexed sequence of communications symbols and a second demultiplexed sequence of communications symbols; and means, responsive to said demultiplexing means, for decoding the first and second demultiplexed sequences according to the first and second error correction codes to produce an estimated sequence of information symbols representing an estimate of the source sequence of information symbols.

7. A system according to claim 6, wherein the random error correction code comprises a binary convolutional code.

8. A system according to claim 6, wherein the burst error correction code comprises a nonbinary convolutional code.

9. A system according to claim 8, wherein the nonbinary convolutional code comprises a dual-k convolutional code.

10. An apparatus for producing a communications signal from a source sequence of information symbols, the apparatus comprising:

parallel error correction encoding means for encoding the source sequence of information symbols according to a plurality of error correction codes to produce a plurality of encoded sequences of symbols, a respective one of the plurality of error correction codes producing one of the plurality of encoded sequences of symbols from the source sequence of information symbols without interleaving;

wherein said parallel error correction encoding means comprises:
a first error correction encoding means for encoding the source sequence of information symbols according to a first error correction code to produce a first encoded sequence of symbols without interleaving the source sequence of information symbols, wherein said first error correction code comprises a random error correction code;
a second error correction encoding means for encoding the source sequence of information symbols according to a second error correction code to produce a second encoded sequence of symbols without interleaving the source sequence of information symbols, wherein said second error correction code comprises a burst error correction code;

means, responsive to said parallel error correction encoding means, for combining the plurality of encoded sequences of symbols to produce a sequence of communications symbols, wherein said means for combining the plurality of encoded sequences of symbols comprises multiplexing means, responsive to said first and second error correction encoding means, for multiplexing the first and second encoded sequences of symbols to produce a sequence of communication symbols; and means, responsive to said means for combining, for processing the sequence of communications symbols to produce a communications signal.

11. An apparatus according to claim 10, wherein the random error correction code comprises a binary convolutional code.

12. An apparatus according to claim 10, wherein the burst error correction code comprises a nonbinary convolutional code.

13. An apparatus according to claim 12, wherein the nonbinary convolutional code comprises a dual-k convolutional code.

14. An apparatus for estimating a source sequence of information symbols from a communications signal received from a communications medium, the communications signal representing a multiplexing of first and second encoded sequences of symbols representing first and second versions of the source sequence of information symbols encoded according to first and second error correction codes, respectively, combined with noise introduced by the communications medium, the apparatus comprising:

means for processing the communicated communications signal to produce a sequence of received communications symbols;

demultiplexing means, responsive to said means for processing the communicated communications signal to produce a sequence of received symbols, for demultiplexing the sequence of received communications symbols to produce a first demultiplexed sequence of communications symbols and a second demultiplexed sequence of communications symbols corresponding to the first encoded sequence of symbols and the second encoded sequence of symbols, respectively; and means, responsive to said demultiplexing means, for decoding the first and second demultiplexed sequences according to the first and second error correction codes to produce an estimated sequence of information symbols representing an estimate of the source sequence of information symbols, wherein said means for decoding the first and second demultiplexed sequences includes:

first soft output decoding means for decoding the first demultiplexed sequence of communications symbols according to the first error correction code to produce a first sequence of soft information values;

second soft output decoding means for decoding the second demultiplexed sequence of communications symbols to produce a second sequence of soft information values; and means, responsive to said first and second soft output decoding means, for combining the first and second sequences of soft information values to produce an estimated sequence of information symbols representing an estimate of the source sequence of information symbols.

15. An apparatus according to claim 14:

wherein said first soft output decoding means comprises means, responsive to said second soft output decoding means, for decoding the first demultiplexed sequence of communications symbols according to the first error correction code augmented by the second sequence of soft information values; and wherein said second soft output decoding means comprises means, responsive to said first soft output decoding means, for decoding the second demultiplexed sequence of communications symbols according to the second error correction code augmented by the first sequence of soft information values.

16. An apparatus according to claim 14, wherein a respective information symbol of the source sequence of information symbols includes at least one bit, a respective bit having one of a first value and a second value associated therewith, and:

wherein said first soft output decoding means comprises means for computing a first soft information value for one bit of one estimated information symbol from the first demultiplexed sequence of communications symbols according to the first error correction code, the first soft information value representing a relative measure of the likelihood of a corresponding bit in a corresponding symbol of the source sequence of information symbols having the first value or the second value;

wherein said second soft output decoding means comprises means for computing a second soft information value for the one bit of the one estimated information symbol from the second demultiplexed sequence according to the second error correction code, the second soft information value representing a relative measure of the likelihood of a corresponding bit in a corresponding symbol of the source sequence of information symbols having the first value or the second value.

17. An apparatus according to claim 16:

wherein said first soft output decoding means comprises means for iteratively computing a soft information value for one bit of one estimated information symbol from the first demultiplexed sequence of communications symbols according to the first error correction code augmented by a soft information value for the one bit of the one estimated information symbol previously computed from the second demultiplexed sequence of communications symbols, until a predetermined iteration criterion is satisfied;

wherein said second soft output decoding means comprises means for iteratively computing a soft information value for the one bit of the one estimated information symbol from the second demultiplexed sequence of communications symbols according to the second error correction code augmented by a soft information value for the one bit of the one estimated information symbol previously computed from the first demultiplexed sequence of communications symbols, until a predetermined iteration criterion is satisfied.

18. An apparatus according to claim 17, further comprising decision means, responsive to said first and said second soft output decoding means, determining a value for the one bit of the one estimated information symbol based on the iteratively computed soft information values.

19. An apparatus for estimating a source sequence of information symbols from a communications signal received from a communications medium, the communications signal representing a multiplexing of first and second encoded sequences of symbols representing first and second versions of the source sequence of information symbols encoded according to first and second error correction codes, respectively, wherein said first error correction code comprises a random error correction code, and wherein the second error correction code comprises a burst error correction code, combined with noise introduced by the communications medium, the apparatus comprising:

means for processing the communicated communications signal to produce a sequence of received communications symbols;

demultiplexing means, responsive to said means for processing the communicated communications signal to produce a sequence of received symbols, for demultiplexing the sequence of received communications symbols to produce a first demultiplexed sequence of communications symbols and a second demultiplexed sequence of communications symbols corresponding to the first encoded sequence of symbols and the second encoded sequence of symbols, respectively; and means, responsive to said demultiplexing means, for decoding the first and second demultiplexed sequences according to the first and second error correction codes to produce an estimated sequence of information symbols representing an estimate of the source sequence of information symbols.

20. An apparatus according to claim 19, wherein the random error correction code comprises a binary convolutional code.

21. An apparatus according to claim 19, wherein the burst error correction code comprises a nonbinary convolutional code.

22. An apparatus according to claim 21, wherein the nonbinary convolutional code comprises a dual-k convolutional code.

23. A method of communicating a source sequence of information symbols over a communications medium, the method comprising the steps of:

encoding the source sequence of information symbols according to a first error correction code to produce a first encoded sequence of symbols;

encoding the source sequence of information symbols according to a second error correction code to produce a second encoded sequence of symbols;

multiplexing the first and second encoded sequences of symbols to produce a sequence of communications symbols;

processing the sequence of communications symbols to produce a communications signal;

communicating the communications signal over the communications medium;

processing the communicated communications signal to produce a sequence of received communications symbols;

demultiplexing the sequence of received communications symbols according to the predetermined multiplexing sequence to produce a first demultiplexed sequence of communications symbols and a second demultiplexed sequence of communications symbols;

decoding the first demultiplexed sequence of communications symbols according to the first error correction code to produce a first sequence of soft information values;

decoding the second demultiplexed sequence of communications symbols according to the second error correction code to produce a second sequence of soft information values; and combining the first and second sequences of soft information values to produce an estimated sequence of information symbols representing an estimate of the source sequence of information symbols.

24. A method according to claim 23:

wherein said step of decoding the first demultiplexed sequence of communications symbols comprises the step of decoding the first demultiplexed sequence of communications symbols according to the first error correction code augmented by the second sequence of soft information values; and wherein said step of decoding the second demultiplexed sequence of communications symbols comprises the step of decoding the second demultiplexed sequence of communications symbols according to the second error correction code augmented by the first sequence of soft information values.

25. A method according to claim 23, wherein a respective information symbol of the source sequence of information symbols includes at least one bit, a respective bit having one of a first value and a second value associated therewith, and:

wherein said step of decoding the first demultiplexed sequence comprises the step of computing a first soft information value for one bit of one estimated information symbol from the first demultiplexed sequence of communications symbols according to the first error correction code, the first soft information value representing a relative measure of the likelihood of a corresponding bit in a corresponding symbol of the source sequence of information symbols having the first value or the second value;

wherein said step of decoding the second demultiplexed sequence comprises the step of computing a second soft information value for the one bit of the one estimated information symbol from the second demultiplexed sequence according to the second error correction code, the second soft information value representing a relative measure of the likelihood of a corresponding bit in a corresponding symbol of the source sequence of information symbols having the first value or the second value.

26. A method according to claim 25:

wherein said step of computing a first soft information value for one bit of one estimated information symbol from the first demultiplexed sequence of communications symbols comprises the step of computing a soft information value for one bit of one estimated information symbol from the first demultiplexed sequence of communications symbols according to the first error correction code augmented by a soft information value for the one bit of the one estimated information symbol previously computed from the second demultiplexed sequence of communications symbols;

wherein said step of computing a second soft information value for the one bit of the one estimated information symbol from the second demultiplexed sequence of communications symbols comprises the step of computing a soft information value for the one bit of the one estimated information symbol from the second demultiplexed sequence of communications symbols according to the second error correction code augmented by a soft information value for the one bit of the one estimated information symbol previously computed from the first demultiplexed sequence of communications symbols; and wherein said step of decoding the first and second demultiplexed sequences further comprises the step of iterating said soft information value computing steps until a predetermined iteration criterion is satisfied.

27. A method according to claim 26, wherein said iterating step is followed by the step of determining a value for the one bit of the one estimated information symbol based on the iterative computed soft information values computed from the first and second demultiplexed sequences of communications symbols.

28. A method according to claim 27, wherein the soft information values computed from the first and second demultiplexed sequences both indicate a greater likelihood that the corresponding bit of the corresponding information symbol from the source sequence of information symbols has the first value than the second value, and wherein said step of determining a value for the one bit of the one estimated information symbols comprises the step of assigning the first value to the one bit of the one estimated information symbol.

29. A method according to claim 27, wherein the soft information value computed from the first demultiplexed sequence indicates greater likelihood that the corresponding bit of the corresponding information symbols from the source sequence of information symbols has the first value than the second value, wherein the soft information value computed from the second demultiplexed sequence indicates greater likelihood that the corresponding bit of the corresponding information symbols from the source sequence of information symbols has the second value than the first value, and wherein said step of determining a value for the one bit of the one estimated information symbols comprises the step of assigning one of the first and second values to the one bit of the one estimated information symbol according to a predetermined selection criterion.

30. A method of communicating a source sequence of information symbols over a communications medium, the method comprising the steps of:
    encoding the source sequence of information symbols according to a first error correction code to produce a first encoded sequence of symbols, wherein said first error correction code comprises a random error correction code;
    encoding the source sequence of information symbols according to a second error correction code to produce a second encoded sequence of symbols, wherein said second error correction code comprises a burst error correction code;
    multiplexing the first and second encoded sequences of symbols to produce a sequence of communications symbols;
    processing the sequence of communications symbols to produce a communications signal;
    communicating the communications signal over the communications medium;
    processing the communicated communications signal to produce a sequence of received communications symbols:
    demultiplexing the sequence of received communications symbols according to the predetermined multiplexing sequence to produce a first demultiplexed sequence of communications symbols and a second demultiplexed sequence of communications symbols; and
    decoding the first and second demultiplexed sequences according to the first and second error correction codes to produce an estimated sequence of information symbols representing an estimate of the source sequence of information symbols.

31. A method according to claim 30, wherein the random error correction code comprises a binary convolutional code.

32. A method according to claim 30, wherein the burst error correction code comprises a nonbinary convolutional code.

33. A method according to claim 32, wherein the nonbinary convolutional code comprises a dual-k convolutional code.

34. A method of producing a communication signal from a source sequence of information symbols, the method comprising the steps of:
    encoding the source sequence of information symbols according to each of a plurality of codes to produce a plurality of encoded sequences of symbols, a respective one of the plurality of codes producing a respective one of the plurality of encoded sequences of symbols from the source sequence of information symbols without interleaving, wherein said step of encoding comprises the steps of:
        encoding the source sequence of information symbols according to a first error correction code to produce a first encoded sequence of symbols without interleaving the source sequence of information symbols, wherein said first error correction code comprises a random error correction code;
        encoding the source sequence of information symbols according to a second error correction code to produce a second encoded sequence of symbols without interleaving the source sequence of information symbols, wherein said second error correction code comprises a burst error correction code;
    combining the plurality of encoded sequences of symbols to produce a sequence of communications symbols, wherein said step of combining the plurality of encoded sequences of symbols comprises the step of multiplexing the first and second encoded sequences of symbols to produce the sequence of communication symbols; and
    processing the sequence of communications symbols to produce a communications signal.

35. A method according to claim 34, wherein the random error correction code comprises a binary convolutional code.

36. A method according to claim 34, wherein the burst error correction code comprises a nonbinary convolutional code.

37. A method according to claim 36, wherein the nonbinary convolutional code comprises a dual-k convolutional code.

38. A method of estimating a source sequence of information symbols from a communications signal received from a communications medium, the communications signal representing a multiplexing of first and second encoded sequences of symbols representing first and second versions of the source sequence of information symbols encoded according to first and second error correction codes, respectively, combined with noise introduced by the communications medium, the method comprising the steps of:
    processing the received communications signal to produce a sequence of received communications symbols;
    demultiplexing the sequence of received communications symbols to produce a first demultiplexed sequence of communications symbols and a second demultiplexed sequence of communications symbols corresponding to the first encoded sequence of symbols and the second encoded sequence of symbols, respectively; and
    decoding the first and second demultiplexed sequences according to the first and second error correction codes to produce an estimated sequence of information symbols representing an estimate of the source sequence of information symbols.

39. A method according to claim 38, wherein said step of decoding the first and second demultiplexed sequences comprises the steps of:

decoding the first demultiplexed sequence of communications symbols according to the first error correction code to produce a first sequence of soft information values;

decoding the second demultiplexed sequence of communications symbols to produce a second sequence of soft information values; and combining the first and second sequences of soft information values to produce an estimated sequence of information symbols representing an estimate of the source sequence of information symbols.

40. A method according to claim 39:

wherein said step of decoding the first demultiplexed sequence of communications symbols comprises the step of decoding the first demultiplexed sequence of communications symbols according to the first error correction code augmented by the second sequence of soft information values; and wherein said step of decoding the second demultiplexed sequence of communications symbols comprises the step of decoding the second demultiplexed sequence of communications symbols according to the second error correction code augmented by the first sequence of soft information values.

41. A method according to claim 38, wherein a respective information symbol of the source sequence of information symbols includes at least one bit, a respective bit having one of a first value and a second value associated therewith, and wherein said step of decoding the first and second demultiplexed communications sequences comprises the steps of:

computing a first soft information value for one bit of one estimated information symbol from the first demultiplexed sequence of communications symbols according to the first error correction code, the first soft information value representing a relative measure of the likelihood of a corresponding bit in a corresponding symbol of the source sequence of information symbols having the first value or the second value;

computing a second soft information value for the one bit of the one estimated information symbol from the second demultiplexed sequence according to the second error correction code, the second soft information value representing a relative measure of the likelihood of a corresponding bit in a corresponding symbol of the source sequence of information symbols having the first value or the second value.

42. A method according to claim 41:

wherein said step of computing a first soft information value for one bit of one estimated information symbol from the first demultiplexed sequence of communications symbols comprises the step of computing a soft information value for one bit of one estimated information symbol from the first demultiplexed sequence of communications symbols according to the first error correction code augmented by a soft information value for the one bit of the one estimated information symbol previously computed from the second demultiplexed sequence of communications symbols;

wherein said step of computing a second soft information value for the one bit of the one estimated information symbol from the second demultiplexed sequence of communications symbols comprises the step of computing a soft information value for the one bit of the one estimated information symbol from the second demultiplexed sequence of communications symbols according to the second error correction code augmented by a soft information value for the one bit of the one estimated information symbol previously computed from the first demultiplexed sequence of communications symbols; and wherein said step of decoding the first and second demultiplexed sequences further comprises the step of iterating said soft information value computing steps until a predetermined iteration criterion is satisfied.

43. A method according to claim 42, wherein said iterating step is followed by the step of determining a value for the one bit of the one estimated information symbol based on the iterative computed soft information values computed from the first and second demultiplexed sequences of communications symbols.

44. A method according to claim 43, wherein the soft information values computed from the first and second demultiplexed sequences both indicate a greater likelihood that the corresponding bit of the corresponding information symbol from the source sequence of information symbols has the first value than the second value, and wherein said step of determining a value for the one bit of the one estimated information symbols comprises the step of assigning the first value to the one bit of the one estimated information symbol.

45. A method according to claim 43, wherein the soft information value computed from the first demultiplexed sequence indicates greater likelihood that the corresponding bit of the corresponding information symbols from the source sequence of information symbols has the first value than the second value, wherein the soft information value computed from the second demultiplexed sequence indicates greater likelihood that the corresponding bit of the corresponding information symbols from the source sequence of information symbols has the second value than the first value, and wherein said step of determining a value for the one bit of the one estimated information symbols comprises the step of assigning one of the first and second values to the one bit of the one estimated information symbol according to a predetermined selection criterion.

46. A method according to claim 38, wherein the first error correction code comprises a random error correction code, and wherein the second error correction code comprises a burst error correction code.

47. A method according to claim 46, wherein the random error correction code comprises a binary convolutional code.

48. A method according to claim 46, wherein the burst error correction code comprises a nonbinary convolutional code.

49. A method according to claim 48, wherein the nonbinary convolutional code comprises a dual-k convolutional code.

* * * * *